(12) United States Patent
Lin et al.

(10) Patent No.: US 6,762,622 B2
(45) Date of Patent: Jul. 13, 2004

(54) OUTPUT BUFFER CIRCUIT FOR EXCESSIVE VOLTAGE PROTECTION

(75) Inventors: Ming-Te Lin, Hsin-Tien (TW); Chin-Hsien Yen, Hsin-Tien (TW)

(73) Assignee: Via Technologies, Inc., Taipei (TW)

(*) Notice: Subject to any disclaimer, the term of this patent is extended or adjusted under 35 U.S.C. 154(b) by 41 days.

(21) Appl. No.: 10/308,020

(22) Filed: Dec. 3, 2002

(65) Prior Publication Data

US 2003/0227295 A1 Dec. 11, 2003

(30) Foreign Application Priority Data

Jun. 11, 2002 (TW) ........................................ 91112580 A

(51) Int. Cl.[7] .............................................. H03K 19/175
(52) U.S. Cl. ............................ 326/81; 326/27; 327/108
(58) Field of Search ........................ 326/81–83, 86–87, 326/26–27; 327/108–112

(56) References Cited

U.S. PATENT DOCUMENTS 5,315,187 A * 5/1994 Cheng ......................... 327/384
5,448,181 A * 9/1995 Chiang ........................ 326/27
5,455,732 A * 10/1995 Davis .......................... 361/90

* cited by examiner

Primary Examiner—James H. Cho
(74) Attorney, Agent, or Firm—Rosenberg, Klein & Lee

(57) ABSTRACT

A output buffer circuit comprises a pull-up transistor, a boost transistor and a boost-controlling circuit. The pull-up transistor has a drain connected to a voltage source, a source connected to an I/O node and a gate connected to a data out through a voltage-boosting node. The boost transistor has a drain connected to the voltage source, and a source connected to the voltage-boosting node. The boost-controlling circuit has an input connected to the I/O node and an output connected to a gate of the boost transistor. The input of the boost-controlling circuit senses an excessive voltage at the I/O node and the output thereof turns on the boost transistor. Therefore, a gate voltage of the pull-up transistor is sustained to a predetermined high level when the pull-up transistor is turned off, and a voltage difference between the gate voltage and a source voltage of the pull-up transistor is reduced.

14 Claims, 3 Drawing Sheets

US 6,762,622 B2

OUTPUT BUFFER CIRCUIT FOR EXCESSIVE VOLTAGE PROTECTION

FIELD OF THE INVENTION

The present invention relates to an output buffer circuit, especially to an output buffer circuit for excessive voltage protection, whereby the risk of device damage and the leak current can be prevented.

BACKGROUND OF THE INVENTION

The developing trends of microelectronic device are more compact size and higher integration on a single chip. As the demand of higher integration and operation speed, the microelectronic device is forced to use lower operation voltage than commonly used rate voltage for reducing power consumption. Therefore, a buffer circuit should be provided between an external circuit and the microelectronic device to adapt a signal voltage difference and to protect a chip core circuit in the microelectronic device.

FIG. 1 shows a conventional output buffer circuit, which is connected between a data out 161 of the chip core and an I/O pad 145 in the demonstrated example. The data out 161 is connected to a first input end of an AND gate 141 and an output control 163 is connected to a second input end of the AND gate 141. The output end of the AND gate 141 is commonly connected to a pull-up circuit and a pull-down circuit at a node 181. The signal of the data out 161 of the chip core is transmitted to the I/O pad 145 through either the pull-up circuit or the pull-down circuit. The pull-up circuit comprises a pull-up transistor 121 and a protective transistor 123. The pull-up transistor 121 has a drain connected to an external voltage source VPP, a source connected to a drain of the protective transistor 123, and a gate connected to the node 181. The protective transistor 123 has a source connected to the I/O pad 145 through a node 183, a gate connected to the external voltage source VPP to form a protective element. The pull-up transistor 121 is turned on or off by the data out 161 and the voltage level at the node 183 is conditionally boosted by the pull-up transistor 121.

The pull-down circuit has an inverter 143, a pull-down transistor 127 and a protective transistor 125. The protective transistor 125 has a drain connected to the node 183, a source connected to a drain of the pull-down transistor 127, and a gate connected to the external voltage source VPP to form a protective element. The pull-down transistor 127 has a source connected to a ground voltage VGG. The inverter 143 has an input end connected to the node 181 and an output connected to a gate of the pull-down transistor 127. When the data out 161 is a low output ("zero"), the voltage at the node 181 is also a low output. At this time, the inverter 143 has a high output to turn on the pull-down transistor 127 and the voltage level at the node 183 is dropped to provide a low-level output for the I/O pad 145.

The above-mentioned output buffer circuit provides voltage buffer for the chip core circuit and external circuit. However, the above-mentioned output buffer circuit uses two cascaded transistors, which occupies considerable area due to increased channel width. The channel width should be increased to provide compatible current driving ability as single transistor in condition of same channel length.

Moreover, the output buffer circuit in scheme of two cascaded transistors also hinders a discharge path between the I/O pad 145 and VPP/VGG for electrostatic discharge (ESD). It is difficult to turn on transistors in cascaded arrangement.

SUMMARY OF THE INVENTION

It is an object of the present invention to provide an output buffer circuit for excessive voltage protection, whereby the risk of device damage and the leak current can be prevented.

In one aspect of the present invention, the output buffer circuit for excessive voltage protection uses a stage of pull-up transistor as output buffer with reduced occupied area.

In another aspect of the present invention, the output buffer circuit for excessive voltage protection uses s a stage of pull-up transistor with a boost circuit on a gate thereof. The gate voltage of the pull-up transistor is sustained to a certain high level when the pull-up transistor is turned off. The voltage difference between the gate voltage and the source voltage of the pull-up transistor can be reduced. The risk of device damage and the leak current can be prevented.

In still another aspect of the present invention, the output buffer circuit for excessive voltage protection has a transmission gate for a data out to protect the chip core circuit in the microelectronic device.

In still another aspect of the present invention, the output buffer circuit for excessive voltage protection has a boost circuit with a boost element and a boost-controlling circuit. The boost-controlling circuit senses the excessive voltage at the I/O node and activates the boost element to boost the gate voltage of the pull-up transistor.

In still another aspect of the present invention, the output buffer circuit for excessive voltage protection has an electrostatic discharge (ESD) protecting circuit to provide further protection.

The various objects and advantages of the present invention will be more readily understood from the following detailed description when read in conjunction with the appended drawing, in which:

DETAILED DESCRIPTION OF THE INVENTION

Figure 1:
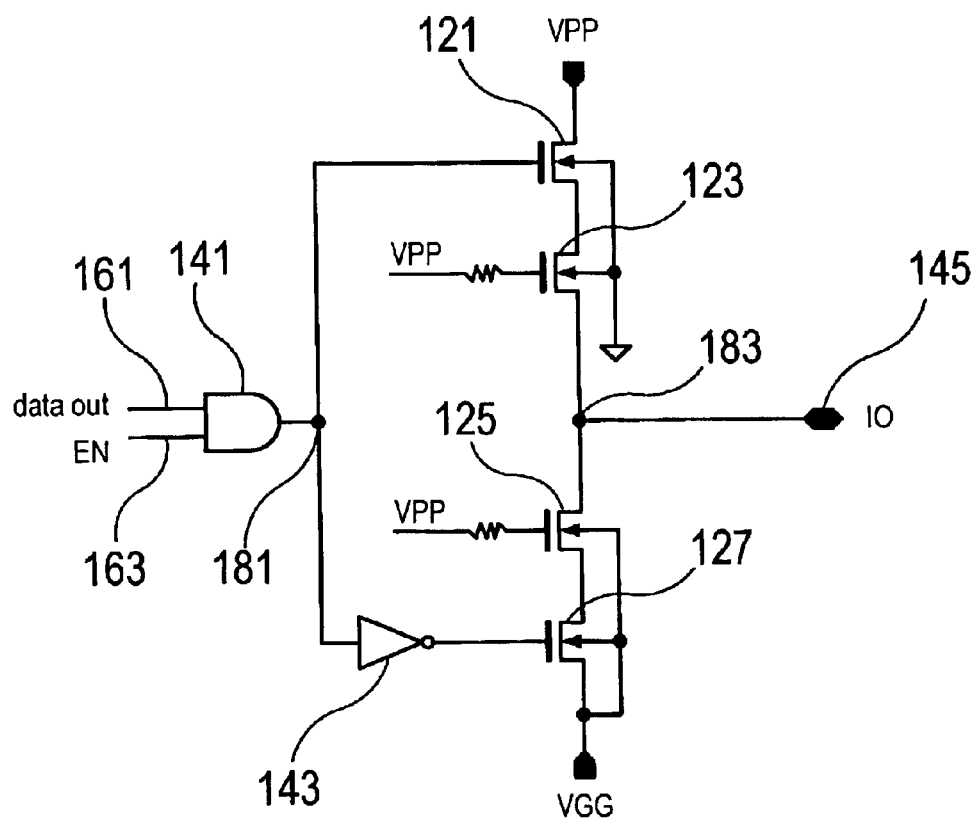
FIG. 1 shows a conventional output buffer circuit.
Figure 2:
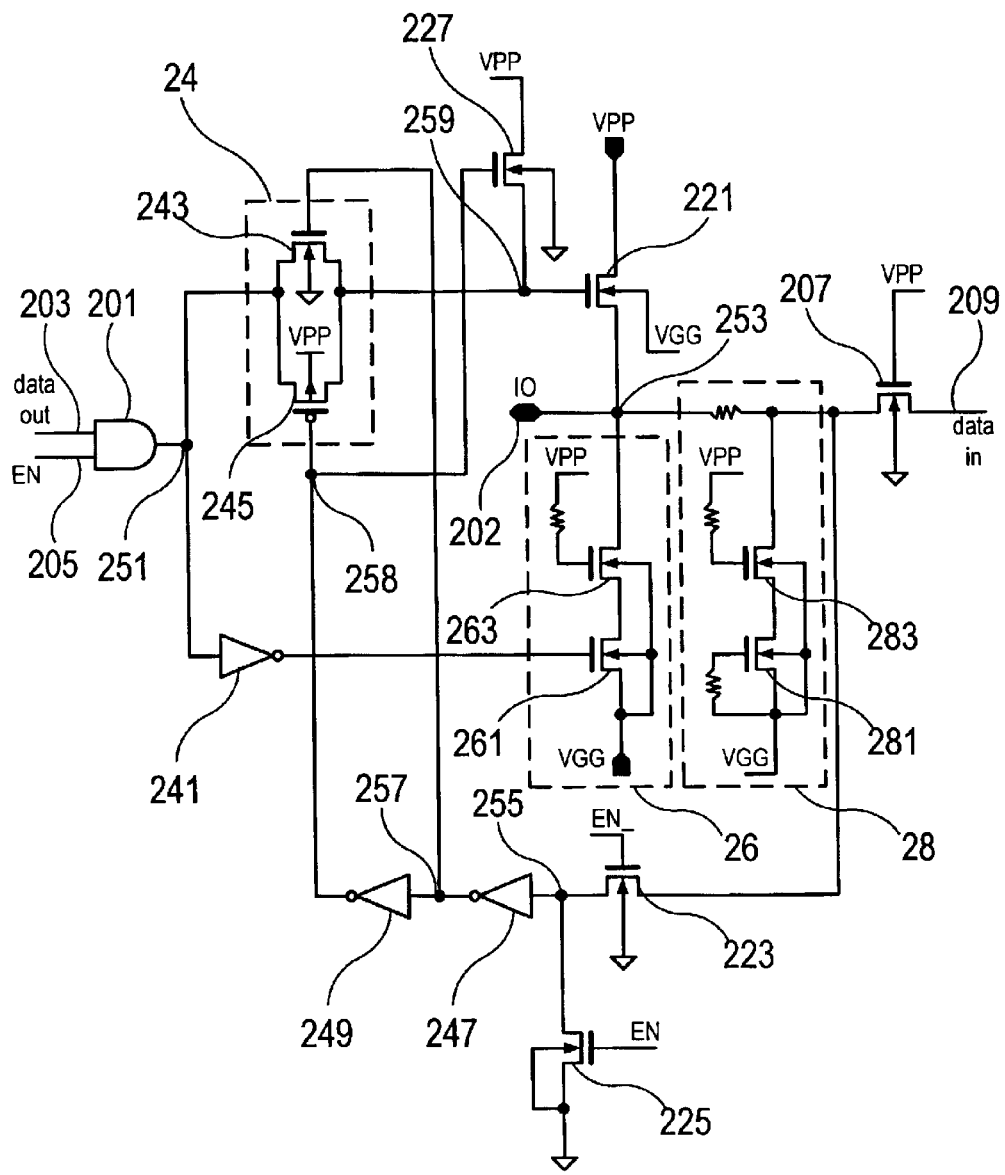
FIG. 2 shows a circuit diagram of a preferred embodiment of the present invention.

FIG. 2 shows a circuit diagram of a preferred embodiment of the present invention. The inventive output buffer circuit is constructed for a data out 203 of the chip core circuit. The data out 203 is connected to a first input end of an AND gate 201 and an output control 205 is connected to a second input end of the AND gate 201. The output end of the AND gate 141 is commonly connected to a pull-up circuit and a pull-down circuit at a node 251. The data out 203 sends output conditionally determined by an output enable signal EN of the output control 205. An I/O pad 202 is connected to an I/O node 253. The I/O node 253 is connected to an external voltage source VPP through a pull-up transistor 221. The pull-up transistor 221 has a drain connected to the external voltage source VPP, a source connected to the I/O node 253 and a gate connected to an output signal of the data out 203 through a voltage-boosting node 259. The pull-up transistor 221 is turned on when the output signal of the data out 203 is high and a voltage at the I/O node 253 is boosted. The pull-up transistor 221 is turned off when the output signal of the data out 203 is low. Therefore, the pull-up transistor 221 takes charge in voltage adjustment for high-level output signal.

A pull-down buffer 26 is provided between the I/O node 253 and a ground voltage VGG to adjust voltage level for low-level output signal. The pull-down buffer 26 comprises a protecting transistor 263 with a drain connected to the I/O node 253, a gate connected to the external voltage source VPP, and a source connected to a drain of a pull-down transistor 261 to form a protecting element. The pull-down transistor 261 has a source connected to the ground voltage VGG and a gate connected to the node 251 through an inverter 241. The pull-down transistor 261 is turned on when the output signal of the data out 203 is low and a voltage at the I/O node 253 is dropped. The pull-down transistor 261 is turned off when the output signal of the data out 203 is high.

In the prevent invention, a boost transistor 227 is provided for the protection of the pull-up transistor 221. The boost transistor 227 has a drain connected to the external voltage source VPP, a source connected to the voltage-boosting node 259, and a gate connected to a boost-controlling circuit. The boost-controlling circuit issues a control signal to turn on the boost transistor 227 and boost a voltage at the voltage-boosting node 259 when an excessive voltage appears at the I/O node 253.

The boost-controlling circuit comprises a controlling transistor 223, a second controlling transistor 225, a high-threshold inverter 247 and a low-threshold inverter 249. The pull-up circuit may be incorporated with a transmission gate 24 composed of an NMOS transistor 243 and a PMOS transistor 245 in parallel arrangement between the voltage-boosting node 259 and the I/O node 253 in order for further protection of the chip core circuit.

The controlling transistor 223 of the boost-controlling circuit has a drain connected to the I/O node 253, a source connected to a node 255, and a gate connected to an inverted output enable signal EN_, which is inverted to the output enable signal EN (that is, EN_ is logical zero when EN is logical one, and EN_ is logical one when EN is logical zero). The second controlling transistor 225 has a drain connected to the node 255, a source connected to ground, and a gate connected to the output enable signal EN. The high-threshold inverter 247 has an input connected to the node 255 and an output connected to a gate of the NMOS transistor 243 in the transmission gate 24 and an input of the low-threshold inverter 249 through a node 257. The low-threshold inverter 249 has an output connected to the gate of the boost transistor 227 and a gate of the PMOS transistor 245 through a node 258.

When the output enable EN is logical one, the inverted output enable EN_ is logical zero, the voltage at node 255 is reduced to zero, the voltage at node 257 is VPP and the voltage at node 258 is 0V. At this time, the boost transistor 227 is turned off, the transmission gate 24 is turned on and the output signal of the data out 203 is correctly transmitted through the pull-up transistor 221.

When the output enable EN is logical zero, the inverted output enable EN_ is logical one. At this time, the controlling transistor 223 of the boost-controlling circuit is turned on and the second controlling transistor 225 is turned off. The voltage at I/O node 253 will appear at the node 255. Once the I/O node 253 has excessive voltage such that the voltage at node 255 is larger than a threshold voltage of the high-threshold inverter 247, the voltage at node 257 is reduced to 0V, and the voltage at the node 258 is VPP. At this time, the transmission gate 24 is turned off and the boost transistor 227 is turned on. The voltage at the voltage-boosting node 259 is boosted to external voltage source VPP minus a threshold Vt of the boost transistor 227 (VPP−Vt).

By above-mentioned circuit arrangement, the gate voltage of the pull-up transistor 221 is sustained to a certain high level when the pull-up transistor 221 is turned off (the gate voltage thereof is smaller than the source voltage thereof when the pull-up transistor 221 is a PMOS transistor). The voltage difference between the gate voltage and the source voltage of the pull-up transistor 221 can be reduced. The risk of device damage and the leak current can be prevented.

As shown in FIG. 2, the inventive output buffer circuit further comprises an ESD protecting circuit 28 connected to the I/O node 253 and mainly composed of an NMOS transistor 283 and an NMOS transistor 281 in series connection. The NMOS transistor 283 has a gate connected to the external voltage source VPP, and the NMOS transistor 281 has a gate connected to ground and a source connected to ground. The ESD protecting circuit 28 is used to enhance protecting effect for electrostatic discharge. Moreover, a transistor 207 with a gate connected to the external voltage source VPP is provided between the I/O node 253 and a data in 209 to provide buffering effect.

Figure 3:
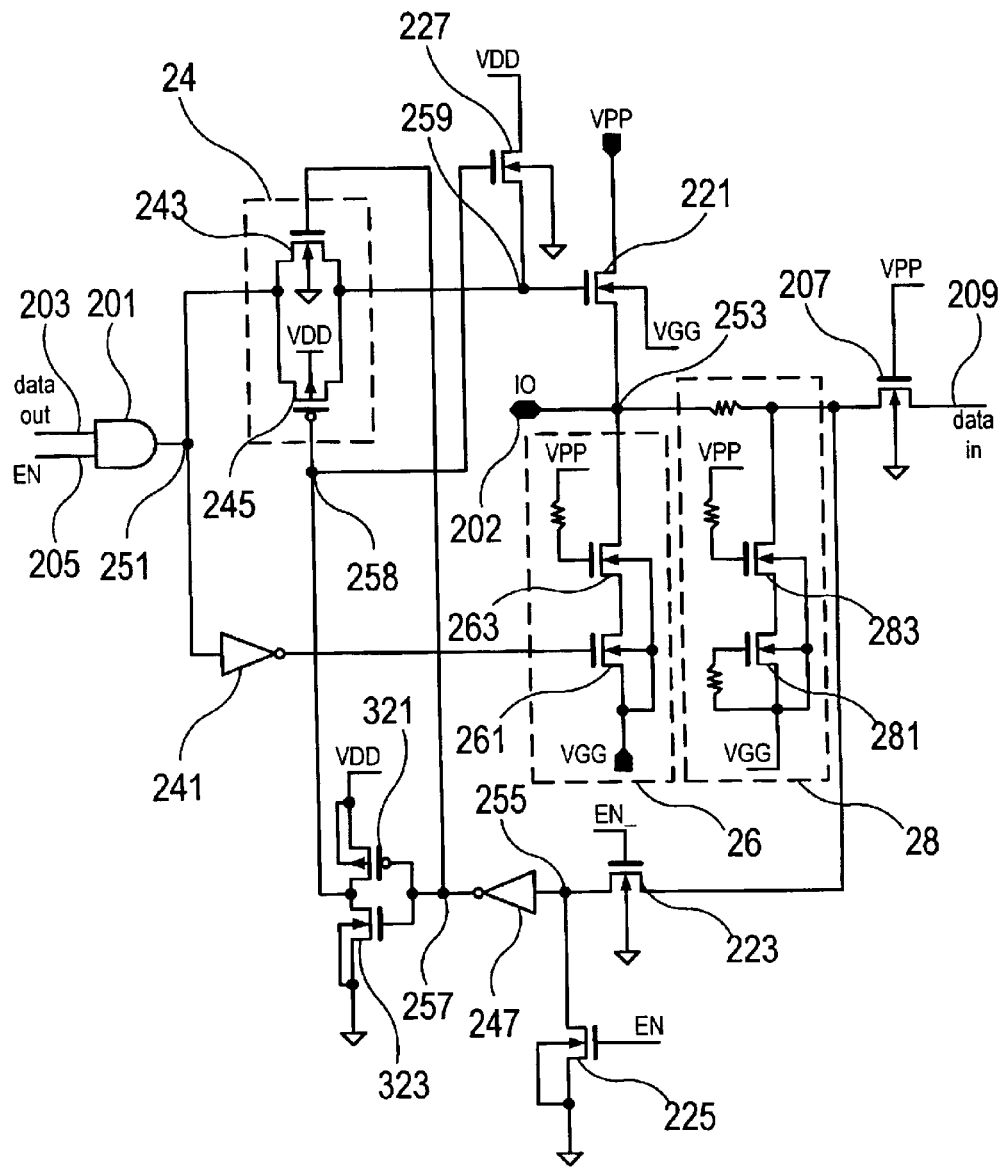
FIG. 3 shows a circuit diagram of another preferred embodiment of the present invention.

FIG. 3 shows a circuit diagram of another preferred embodiment of the present invention. The output buffer circuit is similar to that shown in FIG. 2 except that the drain of the boost transistor 227 is connected to a core voltage VDD for the chip core circuit. The low-threshold inverter 249 is replace by a PMOS transistor 321 and an NMOS transistor 323 in series connection. The PMOS transistor 321 has a drain connected to VDD, a source connected to the node 258 with a drain of the NMOS transistor 323 and a gate connected to node 257. The NMOS transistor 323 has a source connected to ground and a gate connected to node 257. When the boost-controlling circuit is activated by a high voltage at the I/O node 253, the voltage at node 257 is zero, the voltage at node 258 is VDD to turn off the transmission gate 24 and turn on the boost transistor 227. The voltage at node 259 is raised to VDD-Vt. Therefore, the voltage difference between the gate voltage and the source voltage of the pull-up transistor 221 can also be reduced.

It should be noted that the pull-up transistor and the controlling transistor in each preferred embodiment is realized by NMOS transistor. However, it does mean a limit for the present invention and the replacement by other type of transistor is also included in the patent scope of the present invention.

To sum up, the present invention provides an output buffer circuit using a boost-controlling circuit with a stage of transistor circuit. The gate voltage of the pull-up transistor is boosted when an excessive voltage appears at I/O node. Therefore, the gate voltage of the pull-up transistor is sustained to a certain high level when the pull-up transistor is turned off. The voltage difference between the gate voltage and the source voltage of the pull-up transistor can be reduced. The risk of device damage and the leak current can be prevented.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

We claim:

1. An output buffer circuit for excessive voltage protection, comprising
   a pull-up transistor having a drain connected to an external voltage source, a source connected to an I/O node and a gate connected to a data out through a voltage-boosting node;
   a boost transistor having a drain connected to said external voltage source, and a source connected to said voltage-boosting node;
   a boost-controlling circuit having an input connected to said I/O node and an output connected to a gate of said boost transistor, said input of said boost-controlling circuit sensing an excessive voltage at said I/O node and said output of said boost-controlling circuit sending a signal to turn on said boost transistor, a gate voltage of said pull-up transistor being sustained to a predetermined high level when said pull-up transistor is turned off, a voltage difference between said gate voltage and a source voltage of said pull-up transistor being reduced.

2. The output buffer circuit for excessive voltage protection as in claim 1, wherein said boost-controlling circuit has a controlling transistor having a drain connected to said input of said boost-controlling circuit, a source connected to a gate of said boost transistor and a gate connected to an output enable signal.

3. The output buffer circuit for excessive voltage protection as in claim 2, wherein said boost-controlling circuit further has a second controlling transistor having a drain connected to said source of said controlling transistor, a source connected to ground and a gate connected to a control signal inverted to said output enable signal.

4. The output buffer circuit for excessive voltage protection as in claim 2, wherein said controlling transistor is an n-channel transistor.

5. The output buffer circuit for excessive voltage protection as in claim 1, further comprising a transmission gate between said data out and said pull-up transistor, said transmission gate having an input connected to said data out, an output connected to said pull-up transistor through said voltage-boosting node and a control end connected to said source of said controlling transistor, said transmission gate being turned on and turned off by said controlling transistor.

6. The output buffer circuit for excessive voltage protection as in claim 5, wherein said boost-controlling circuit further has means for filtering voltage having an input connected to said controlling transistor and an output connected to said control end of said transmission gate and said gate of said boost transistor, said means for filtering voltage sending a working signal from said output thereof when a voltage level at said input thereof is higher than a predetermined threshold.

7. The output buffer circuit for excessive voltage protection as in claim 6, wherein said means for filtering voltage is composed of a high-threshold inverter and a low-threshold inverter, said high-threshold inverter having an input connected to said source of said controlling transistor and an output connected to an input of said low-threshold inverter, said low-threshold inverter having an output connected to said control end of said transmission gate and said gate of said boost transistor.

8. The output buffer circuit for excessive voltage protection as in claim 7, wherein said drain of said boost transistor is connected to a core voltage for a chip core circuit, said low-threshold inverter is replaced by a p-channel transistor and an n-channel transistor, said p-channel transistor having a drain connected to said core voltage, a source connected to said control end of said transmission gate and said gate of said boost transistor with a drain of said n-channel transistor, said n-channel transistor having a source connected to ground and a gate connected to said output of said high-threshold inverter with a gate of said p-channel transistor.

9. The output buffer circuit for excessive voltage protection as in claim 5, wherein said transmission gate is composed of an n-channel transistor and a p-channel transistor in parallel connection.

10. The output buffer circuit for excessive voltage protection as in claim 9, wherein said boost-controlling circuit has a high-threshold inverter and a low-threshold inverter, said high-threshold inverter having an input connected to said source of said controlling transistor and an output connected to an input of said low-threshold inverter and a gate of said n-channel transistor of said transmission gate, said low-threshold inverter having an output connected to a gate of said p-channel transistor of said transmission gate and said gate of said boost transistor.

11. The output buffer circuit for excessive voltage protection as in claim 1, further comprising an electrostatic discharge (ESD) protecting circuit connected to the I/O node.

12. The output buffer circuit for excessive voltage protection as in claim 1, wherein said pull-up transistor is an n-channel transistor.

13. The output buffer circuit for excessive voltage protection as in claim 1, wherein said boost transistor is an n-channel transistor.

14. The output buffer circuit for excessive voltage protection as in claim 1, further comprising a pull-down circuit connected to said I/O node.

* * * * *